(12) United States Patent
Priel et al.

(10) Patent No.: US 7,941,721 B2
(45) Date of Patent: May 10, 2011

(54) SYSTEM AND A METHOD FOR TESTING CONNECTIVITY BETWEEN A FIRST DEVICE AND A SECOND DEVICE

(75) Inventors: Michael Priel, Hertzelia (IL); Leonid Fleshel, Hertzelia (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 12/550,516

(22) Filed: Aug. 31, 2009

(65) Prior Publication Data

US 2011/0055648 A1    Mar. 3, 2011

(51) Int. Cl.
*G06F 11/00* (2006.01)
(52) U.S. Cl. .......................... 714/736; 714/726
(58) Field of Classification Search .................. 703/25; 714/27, 724, 727, 718, 736, 726
See application file for complete search history.

(56) References Cited

U.S. PATENT DOCUMENTS

| | | | |
|---|---|---|---|
| 5,519,715 A | 5/1996 | Hao et al. | |
| 5,568,492 A * | 10/1996 | Flint et al. | 714/724 |
| 6,091,261 A | 7/2000 | De Lange | |
| 6,356,107 B1 | 3/2002 | Tang et al. | |
| 6,378,094 B1 * | 4/2002 | Chakraborty et al. | 714/727 |
| 6,861,867 B2 | 3/2005 | West et al. | |
| 6,975,980 B2 * | 12/2005 | Whetsel | 703/25 |
| 7,036,055 B2 | 4/2006 | Muljono et al. | |
| 7,185,250 B2 * | 2/2007 | Whetsel | 714/726 |
| 7,538,574 B1 | 5/2009 | Tang et al. | |
| 7,631,231 B2 * | 12/2009 | Nguyen et al. | 714/718 |
| 7,657,790 B2 * | 2/2010 | Whetsel | 714/27 |
| 7,757,139 B2 * | 7/2010 | Hua | 714/727 |

* cited by examiner

*Primary Examiner* — David Ton

(57) ABSTRACT

A device and a method for testing a connectivity between a first device and a second device, the method includes: writing, at a first frequency and in a serial manner, a first test word to a source boundary scan register; writing a content of the source boundary scan register, at a second frequency and in a parallel manner, to a target boundary scan register; wherein the second frequency is higher than the first frequency; reading the content of the target boundary scan register; wherein the source and target boundary scan registers are selected from a first boundary scan register of the first device and a second boundary scan register of the second device; and evaluating a connectivity between the first and second device in response to a relationship between the first test word and the content of the target boundary scan register.

20 Claims, 11 Drawing Sheets

SYSTEM AND A METHOD FOR TESTING CONNECTIVITY BETWEEN A FIRST DEVICE AND A SECOND DEVICE

FIELD OF THE INVENTION

The present invention relates to a system and a method for testing connectivity between a first device and a second device.

BACKGROUND OF THE INVENTION

Modern devices may include multiple integrated circuits that are expected to communicate with each other at a very high frequency.

An integrated circuit can be tested at a very low frequency by using a test access port. FIG. 1 illustrates a prior art integrated circuit 9 that includes IO pins 28. An I/O pad 28 can receive information from JTAG compliant boundary scan cells.

JTAG (also known as IEEE standard 1149.1) was designed in order to test integrated circuits. The IEEE standard 1149.1 defines a test access port (TAP) 9 that may be used to access internal components of an integrated circuit. The TAP includes a boundary scan register 30, a one-bit long bypass register 12, an instruction register 18, a TAP controller 20, and an optional user defined data register 14.

TAP 9 receives various signals including a clock signal TCK, a test data input signal TDI, a test mode select signal TMS. The TAP can output a test data output signal TDO. Various control signals provided by the TAP controller 20, especially in response to TMS signals, select a path between the TDI and TDO ports of TAP 9.

The instruction register 18 forms an instruction path while each of the boundary scan register 30, bypass register 12 and the optional user defined data register 14 defines a data path. Each data path and instruction path can be regarded as an internal test path of the TAP.

The TAP controller 20 is a state machine that can apply many stages, including various IEEE standard 1149.1 mandatory states. These mandatory states are controlled by the TMS signal.

FIG. 2 illustrates the multiple states of TAP controller 20, which include test logic reset 40, run-test/idle 41, select DR scan 42, capture DR 43, shift DR 44, exit1 DR 45, pause DR 46, exit2 DR 47, update DR 48, select IR scan 52, capture IR 53, shift IR 54, exit1 IR 55, pause IR 56, exit2 IR 57 and update IR 58. The stages are illustrated as boxes that are linked to each other by arrows. The arrows are accompanied by digits (either 0 or 1) that illustrate the value of the TMS signal. These stages are well known in the art and require no further explanation.

Generally, TAP controller 20 sends control signals that allow to serially input information into selected data and instruction paths, to retrieve information from said paths and to serially propagate (shift) information along data and instruction paths.

JTAG is not adapted to test the connectivity between two devices that are expected to communicate with each other at a high frequency.

SUMMARY OF EMBODIMENTS OF THE INVENTION

The present invention provides a method and a device as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

Figure 1:
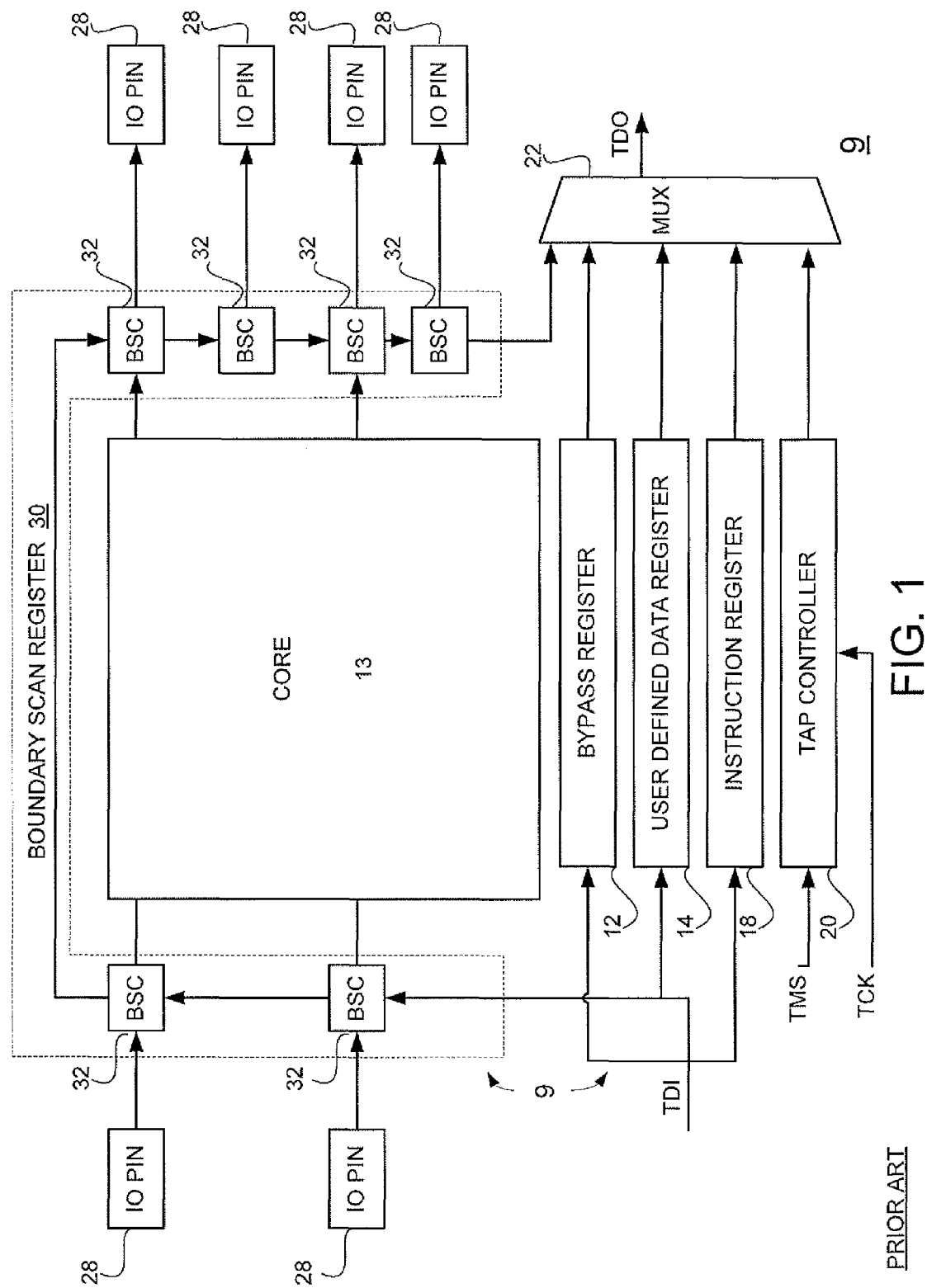
FIG. 1 illustrates a prior art integrated circuit that includes IO pad circuits that can receive information from JTAG compliant boundary scan cells, and receive IO pad configuration signals from a core.
Figure 2:
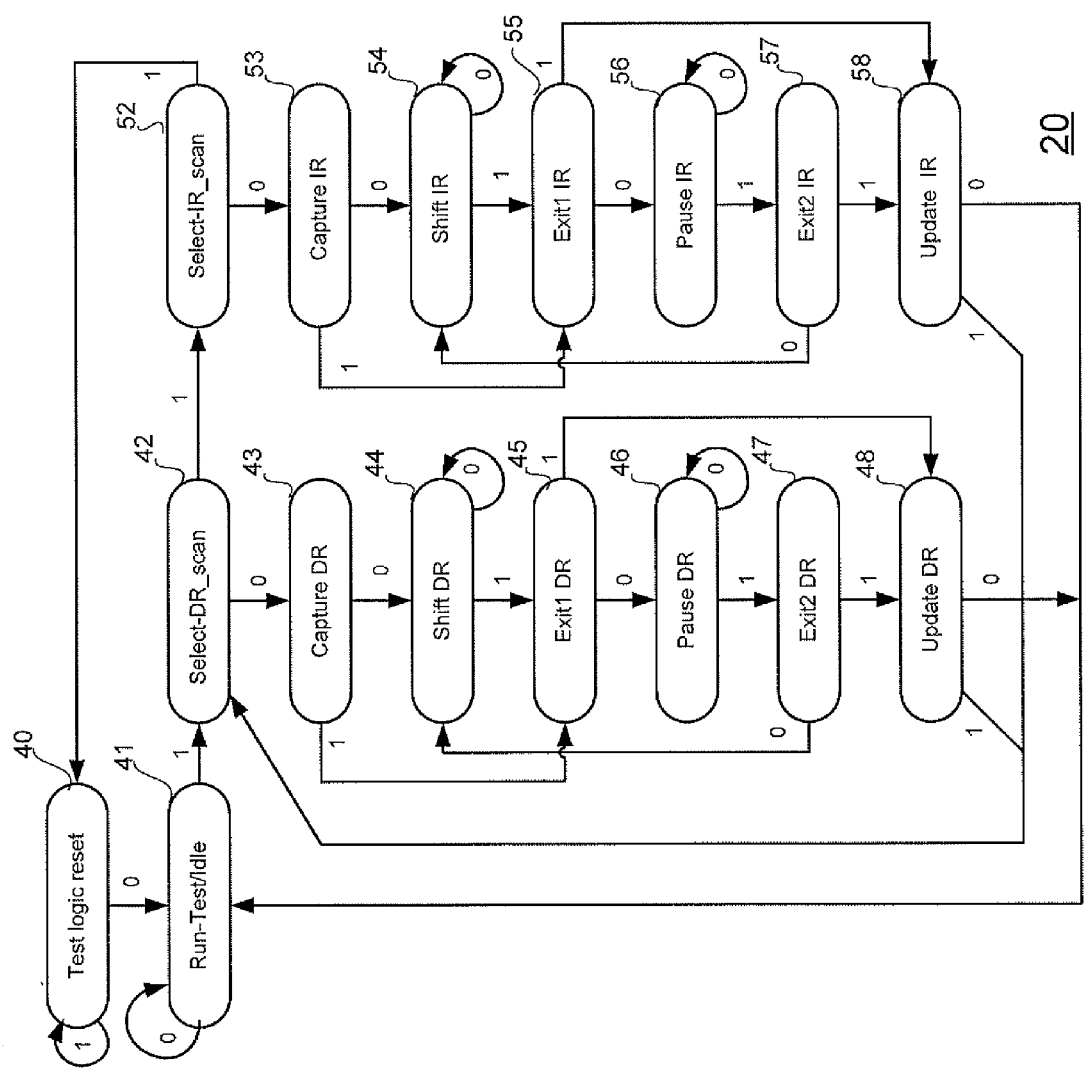
FIG. 2 illustrates the multiple states of the TAP controller.

In the following specification, because the apparatus implementing the present invention is, for the most part, composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

A system is provided. It includes a first device, a second device and a tester. The first device includes a first boundary scan register and the second device comprises a second boundary scan register. The first boundary scan register and the second boundary scan register are coupled to each other in a parallel manner. The first boundary scan register is configured to receive in a serial manner and at a first frequency, a first test word. During a first writing iteration the source boundary scan register is the first boundary scan register and its content should be the first test word. After the first test word was written to that source boundary scan register its content is sent to the second boundary scan register that is a target boundary scan register. It is noted that multiple writing iterations can alter the content of the source boundary scan register. The tester is configured to control the writing of the content of the source boundary scan register at second frequency and in a parallel manner, to the target boundary scan register. The second frequency is higher than the first frequency. The source and target boundary scan registers are selected from the first and second boundary scan registers. The tester is configured to read the content of the target boundary scan register and evaluate connectivity between the first and second devices, in response to a relationship between the first test word and the content of the target boundary scan register.

The system may further include a target shadow register and the tester may be configured to: control a writing, in a parallel manner, of a second test word to the source boundary scan register; control a writing of a content of the target boundary scan register to the target shadow register; control a writing, in a parallel manner and at the second frequency, of the content of the source boundary register to the target boundary scan register; and evaluate of the connectivity between the first and second device in response to the first test word, the second test word, a content of the target shadow register and the content of the source boundary scan register.

The system may include a source shadow register that is coupled in a parallel manner to the source boundary scan register. In this case the controller may be configured to control the writing of the second test word to the source boundary scan register from the source shadow register.

The tester may be configured to control a writing of the content of the first boundary scan register to the second boundary scan register and a writing of the content of the second boundary scan register to the first boundary scan register.

Figure 3:
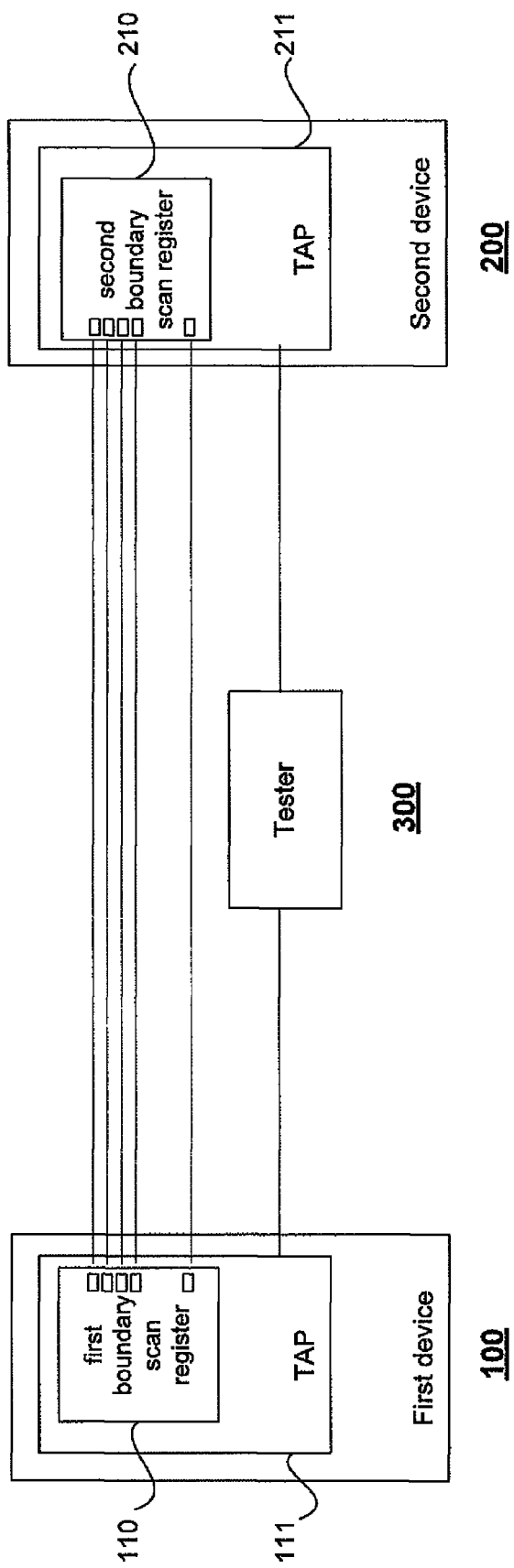
FIG. 3 illustrates an example of a system according to an embodiment of the invention.

FIG. 3 illustrates an example of an embodiment of system 10. System 10 includes a first device 100, a second device 200 and a tester 300. First device 100 includes a first boundary scan register 110 and second device 200 includes a second boundary scan register 210. First boundary scan register 110 and second boundary scan register 210 are coupled to each other in a parallel manner—each boundary scan cell of first boundary scan register 110 is coupled to a corresponding boundary scan cell of second boundary scan register 210.

Each of first and second boundary scan registers 110 and 210 can be a part of a test access port (TAP) such as TAP 111 and 211.

Tester 300 is connected to TAPs 111 and 211 and can control the provision of test words to boundary scan registers 110 and 210, the writing (in parallel) of content of one boundary scan register to another and the serial retrieval of content of either one of the boundary scan registers. Tester 300 controls the first and second TAPs 111 and 211 by sending control signals such as but not limited to TMS (for selecting the operational mode of the TAP), by controlling the provision of test words to boundary scan registers and by controlling the output of the content of one boundary scan register to the other.

An example of a test sequence is provided below:
a. Tester 300 controls a provision of a first test word to first boundary scan register 110. The first test word may be provided in a serial manner, via test data input signal TDI of TAP 111. The first test word is provided at a first frequency f1—TAP is clocked by clock signal TCK of the first frequency;
b. Tester 300 controls a provision of the content of first boundary scan register 110, in parallel, and at second frequency f2, to second boundary scan register 210;
c. Tester 300 controls a provision of the content of second boundary scan register 210 in a serial manner, via test data output signal TDO; and
d. Tester 300 determines the connectivity between first and second boundary scan registers 110 and 210 by comparing the content of second boundary scan register 210 and the first test word. If, for example, the content of second boundary scan register 210 differs from the first test word then tester 300 can generate a connectivity alert. Tester 300 can, additionally or alternatively, initiate another test sequence.

Figure 4:
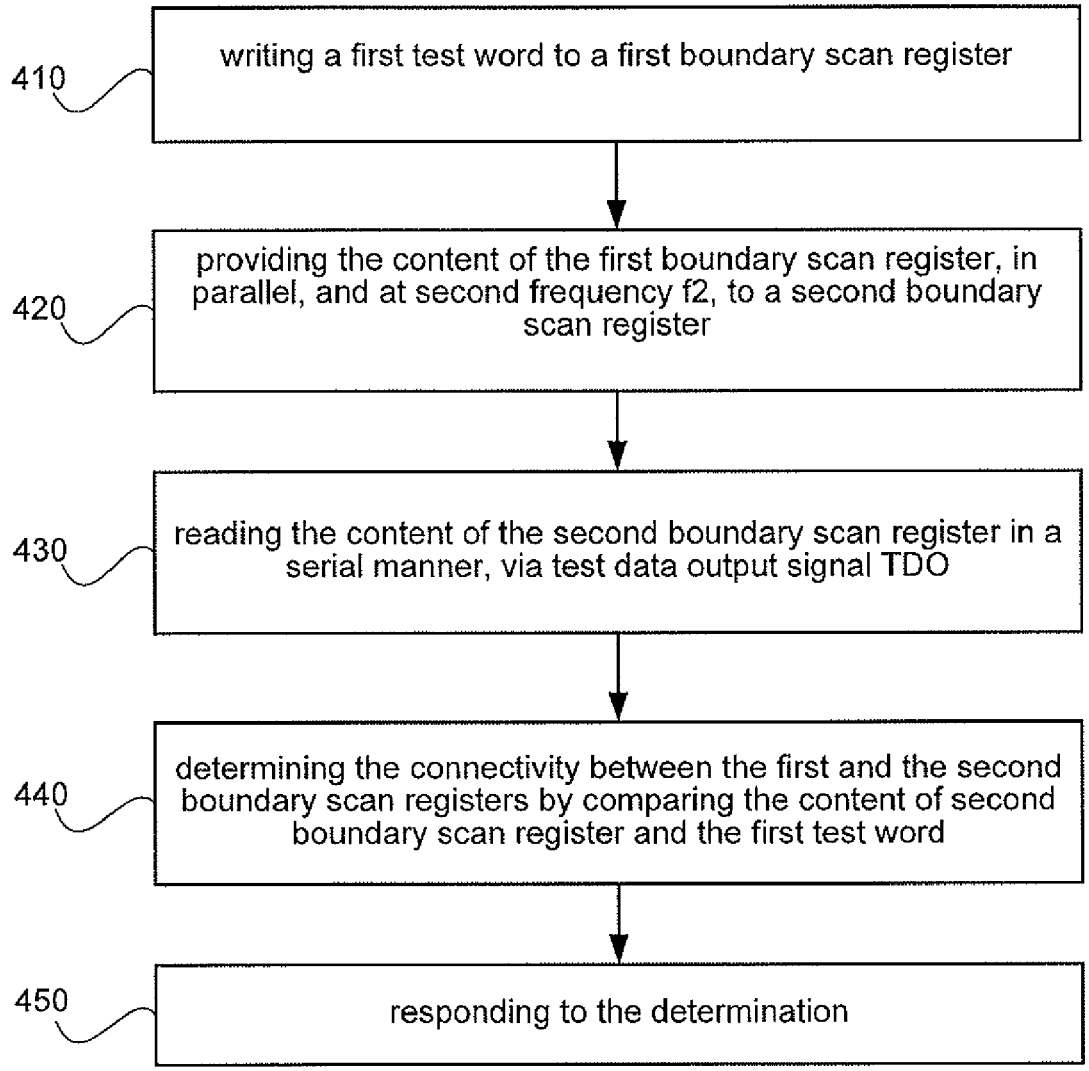
FIG. 4 illustrates a flow diagram of a method according to an embodiment of the invention.

FIG. 4 illustrates a sample of an embodiment of method 400.

Method 400 starts by stage 410 of writing a first test word to a first boundary scan register such as first boundary scan register 110 of FIG. 3. The first test word may be provided in a serial manner, via test data input signal TDI of a test access port that includes the first boundary scan register. The first test word is provided at a first frequency f1—TAP is clocked by clock signal TCK of the first frequency.

Stage 410 is followed by stage 420 of providing the content of the first boundary scan register, in parallel, and at second frequency f2, to a second boundary scan register such as second boundary scan register 210 of FIG. 3.

Stage 420 is followed by stage 430 of reading the content of the second boundary scan register in a serial manner, via test data output signal TDO.

Stage 430 is followed by stage 440 of determining the connectivity between the first and the second boundary scan registers by comparing the content of second boundary scan register and the first test word.

Stage 440 is followed by stage 450 of responding to the determination. If, for example, the content of second boundary scan register differs from the first test word then stage 450 can include generating a connectivity alert, initiating another test sequence, and the like.

Referring back to FIG. 3, another example of a test sequence is provided below:
a. Tester 300 controls a provision of a first test word to first boundary scan register 110. The first test word may be provided in a serial manner, via test data input signal TDI of TAP 111. The first test word is provided at a first frequency f1—TAP is clocked by clock signal TCK of the first frequency;
b. Tester 300 controls a provision of the content of first boundary scan register 110, in parallel, and at second frequency f2, to second boundary scan register 210;
c. Tester 300 controls a provision of the content of second boundary scan register 210, in parallel, and at second frequency f2, to first boundary scan register 110;
d. Tester 300 controls a provision of the content of first boundary scan register 210 in a serial manner, via test data output signal TDO; and
e. Tester 300 determines the connectivity between first and second boundary scan registers 110 and 210 by comparing the content of first boundary scan register 110 and the first test word. If, for example, the content of first boundary scan register 110 differs from the first test word then tester 300 can generate a connectivity alert. Tester 300 can, additionally or alternatively, initiate another test sequence.

Tester 300 may control multiple iterations of writing, in parallel, the content of one boundary scan register to another boundary scan register. The outcome of these multiple iterations is a provision of a content of a source boundary scan register (for example—first boundary scan register 110 that receives the first test word) to a target boundary scan register (such as second boundary scan register 210 or even first boundary scan register 110).

Figure 5:
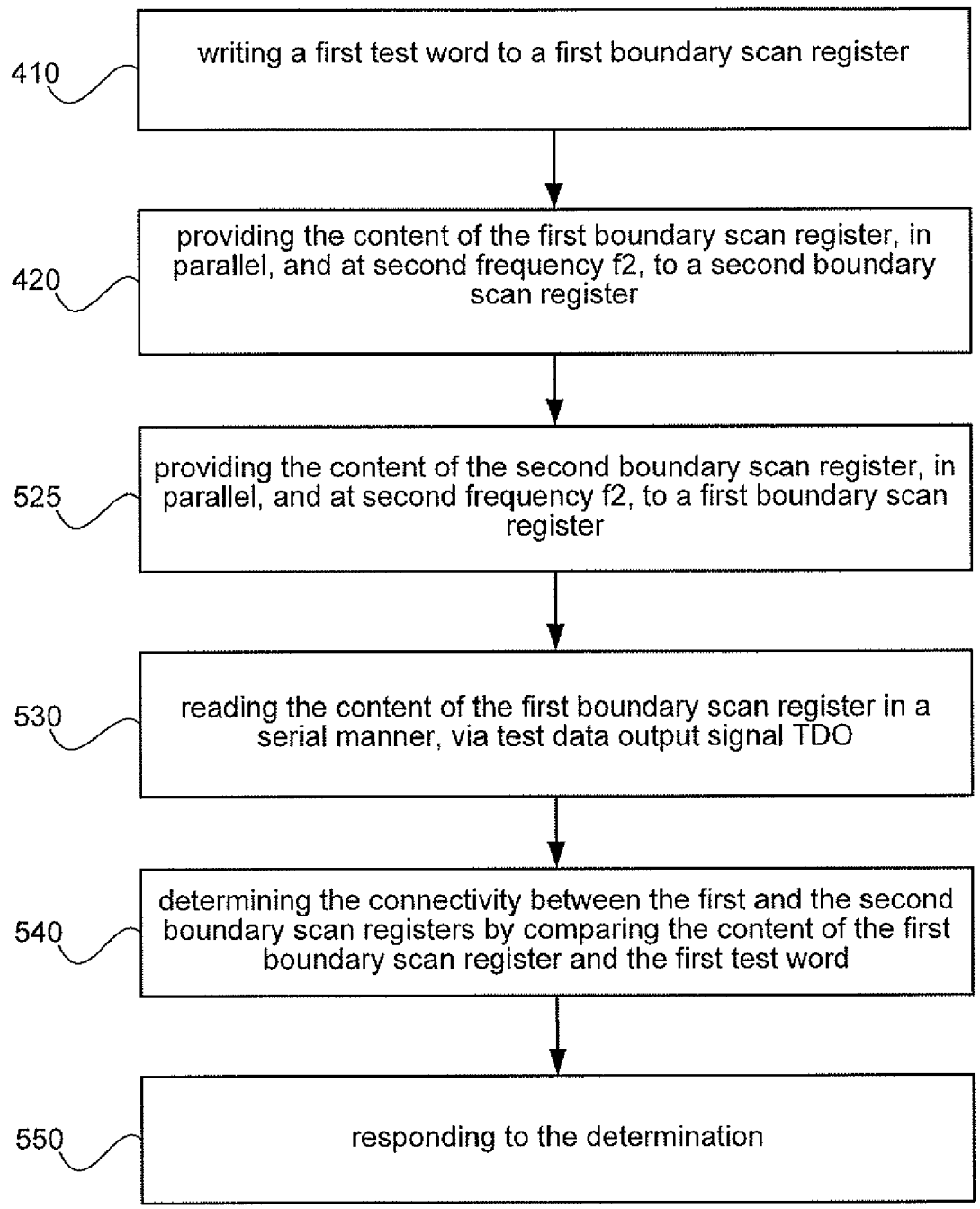
FIG. 5 illustrates a flow diagram of a method according to another embodiment of the invention.

FIG. 5 illustrates a sample of an embodiment of method 500.

Method 500 starts by stage 410 of writing a first test word to a first boundary scan register such as first boundary scan register 110 of FIG. 3. The first test word may be provided in a serial manner, via test data input signal TDI of a test access port that includes the first boundary scan register. The first test word is provided at a first frequency f1—TAP is clocked by clock signal TCK of the first frequency.

Stage 410 is followed by stage 420 of providing the content of the first boundary scan register, in parallel, and at second frequency f2, to a second boundary scan register such as second boundary scan register 210 of FIG. 3.

Stage 420 is followed by stage 525 of providing the content of the second boundary scan register, in parallel, and at second frequency f2, to a first boundary scan register such as first boundary scan register 110 of FIG. 3.

Stage 525 is followed by stage 530 of reading the content of the first boundary scan register in a serial manner, via test data output signal TDO.

Stage 530 is followed by stage 540 of determining the connectivity between the first and the second boundary scan registers by comparing the content of the first boundary scan register and the first test word.

Stage 540 is followed by stage 550 of responding to the determination. If, for example, the content of the first boundary scan register differs from the first test word then stage 550 can include generating a connectivity alert, initiating another test sequence, and the like.

In any of the mentioned above cases second frequency f2 is much higher than first frequency f1. Second frequency f2 can be an operational frequency of first device 100 and first frequency f1 may be a boundary scan register input frequency. First frequency f1 may be lower than one half of the second frequency. It may be one ninth of second frequency f2.

Second frequency f2 may be an operational frequency of first device 100 and wherein first frequency f1 may be a boundary scan register input frequency (the frequency of clock signal TCK) that may be lower than one half of the second frequency.

Figure 6:
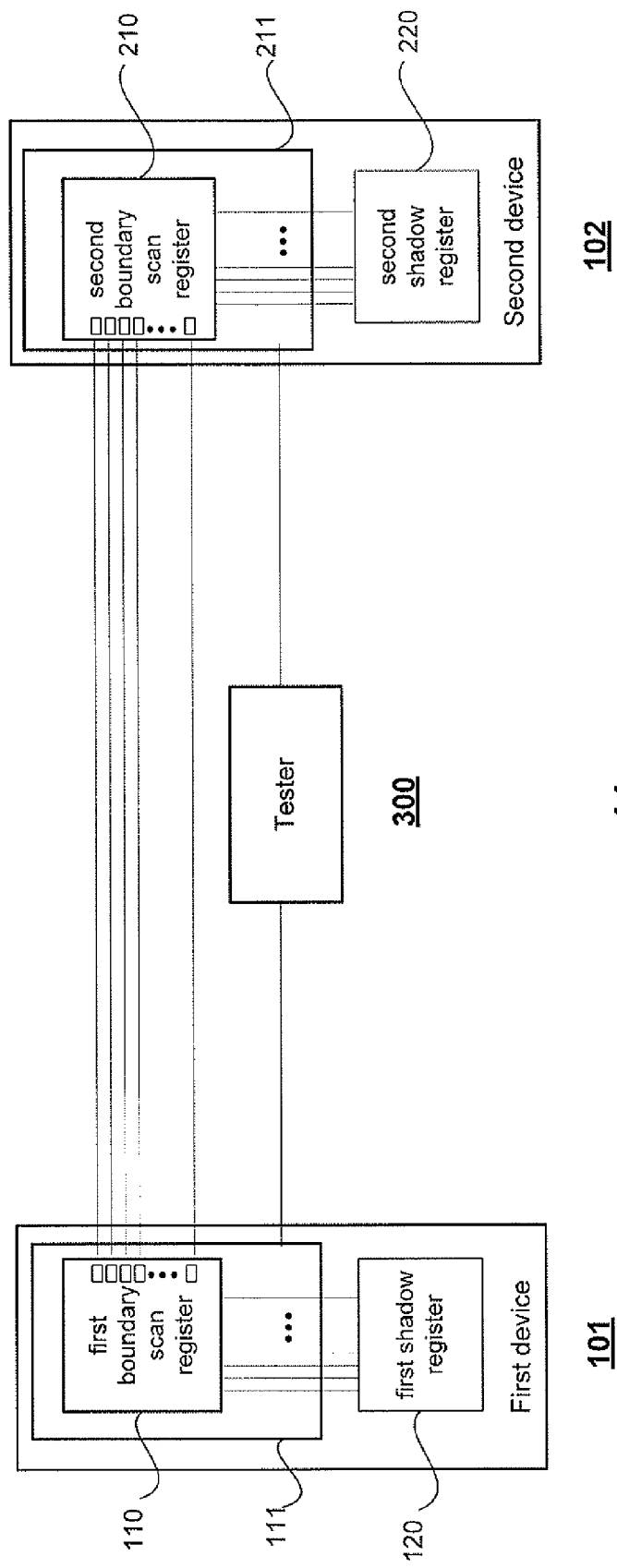
FIG. 6 illustrates an example of a system according to another embodiment of the invention.

FIG. 6 illustrates an example of an embodiment of a system 11. System 11 includes first device 101, second device 201 and tester 300. First device 101 includes first boundary scan register 110 and a first shadow register 120. Second device 201 includes second boundary scan register 211 and a second shadow register 220.

First shadow register 120 is connected in parallel to first boundary scan register 110. Second shadow register 220 is connected in parallel to second boundary scan register 210.

This parallel connectivity facilitates fast transfer of data between these registers. For example, the content of first shadow register 120 can be written to first boundary scan register 110 during one clock cycle, and additionally or alternatively, the content of second boundary scan register 210 can be written to second shadow register 220 during one clock cycle. It is noted that these clock cycles can have a duration that is inversely proportional to the second frequency f2. It is further notes that the parallel transfer of content can last a portion of a clock cycle or few clock cycles.

These shadow registers facilitate a writing sequence in which sequential writing operations are executed at a relative high frequency. The writing sequence may be characterized by second frequency f2.

An example of a test sequence is provided below:
a. Tester 300 controls a provision of a first test word to first boundary scan register 110. The first test word may be provided in a serial manner, via test data input signal TDI of TAP 111. The first test word is provided at a first frequency f1—TAP is clocked by clock signal TCK of the first frequency.
b. Tester 300 controls a provision of the content (first test word) of first boundary scan register 110, in parallel, and at second frequency f2, to second boundary scan register 210.
c. Tester 300 controls a provision of the content of second boundary scan register 210, in parallel and at second frequency f2 to second shadow register 220 and controls a provision of the content of first shadow register, in parallel, at second frequency f2, to first boundary scan register 110.
d. Tester 300 controls a provision of the content (second test word) of first boundary scan register 110, in parallel, and at second frequency f2, to second boundary scan register 210.
e. Tester 300 determines the connectivity between first and second boundary scan registers 110 and 210 by comparing the content of second boundary scan register 210 and the second test word and by comparing the first test word to the first test word. If, for example, the content of second boundary scan register 210 differs from the first test word then tester 300 can generate a connectivity alert. Tester 300 can, additionally or alternatively, initiate another test sequence.

Figure 7:
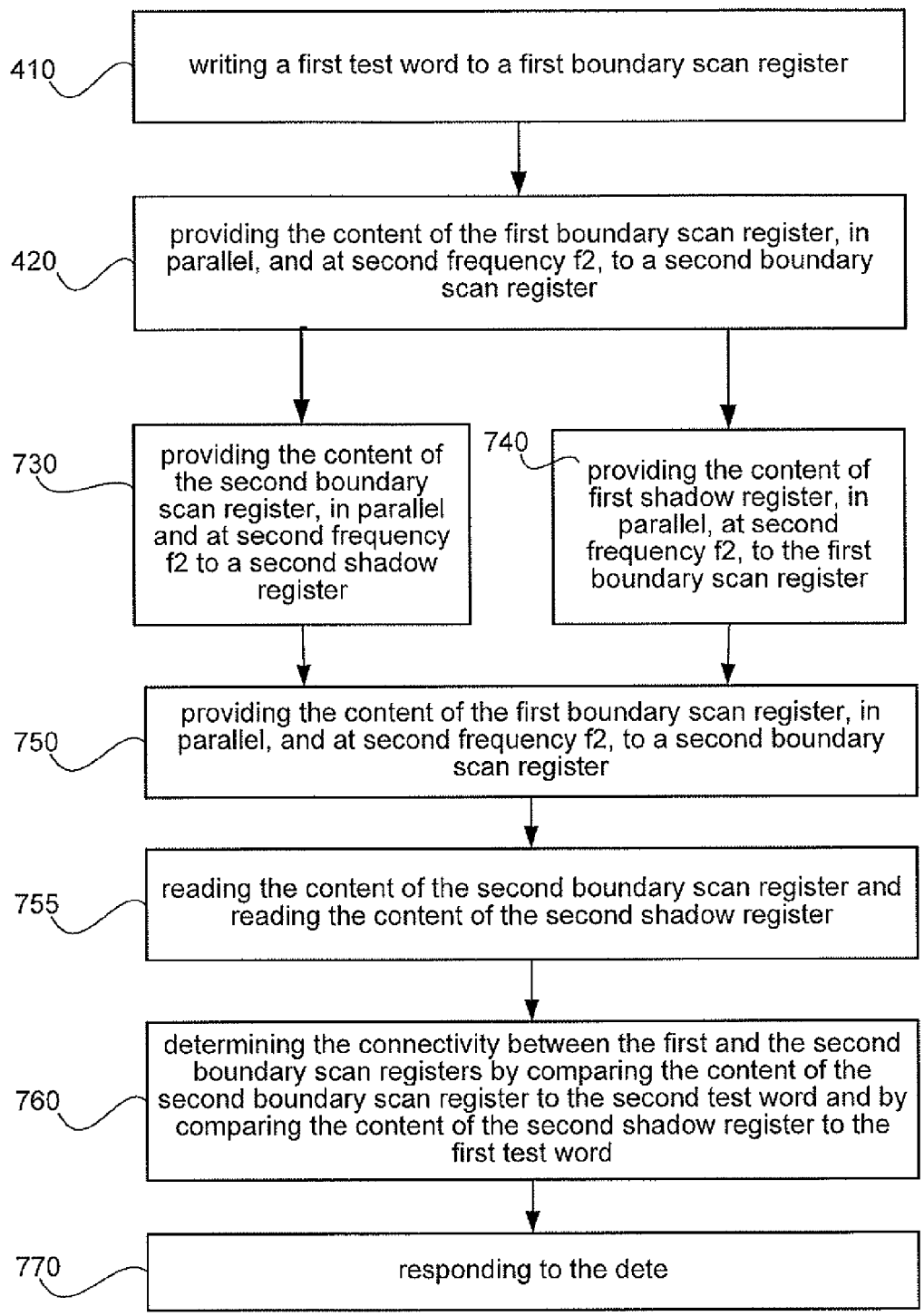
FIG. 7 illustrates a flow diagram of a method according to another embodiment of the invention.

FIG. 7 illustrates a sample of an embodiment of method 700.

Method 700 starts by stage 410 of writing a first test word to a first boundary scan register such as first boundary scan register 110 of FIG. 3. The first test word may be provided in a serial manner, via test data input signal TDI of a test access port that includes the first boundary scan register. The first test word can be provided in parallel.

Stage 710 is followed by stage 420 of providing the content of the first boundary scan register, in parallel, and at second frequency f2, to a second boundary scan register such as second boundary scan register 210 of FIG. 3.

Stage 420 is followed by stages 730 and 740.

Stage 730 includes providing the content of the second boundary scan register, in parallel and at second frequency f2 to a second shadow register.

Stage 740 includes providing the content of first shadow register, in parallel, at second frequency f2, to the first boundary scan register.

Stages 730 and 740 are followed by stage 750 of providing the content of the first boundary scan register, in parallel, and at second frequency f2, to a second boundary scan register.

Stage 750 is followed by stage 755 of reading the content of the second boundary scan register and reading the content of the second shadow register. Stage 755 can include reading the content of either one of these registers in a serial or a parallel manner.

Stage 755 is followed by stage 760 of determining the connectivity between the first and the second boundary scan registers by comparing the content of the second boundary scan register to the second test word and by comparing the content of the second shadow register to the first test word.

Stage 760 is followed by stage 770 of responding to the determination. If, for example, the content of second boundary scan register differs from the first test word then stage 770 can include generating a connectivity alert, initiating another test sequence, and the like.

Another test sequence can include sending the content of second boundary scan register 210 (or the content of second shadow register 220) to first boundary scan register 110 (or to first shadow register 120).

Figure 8:
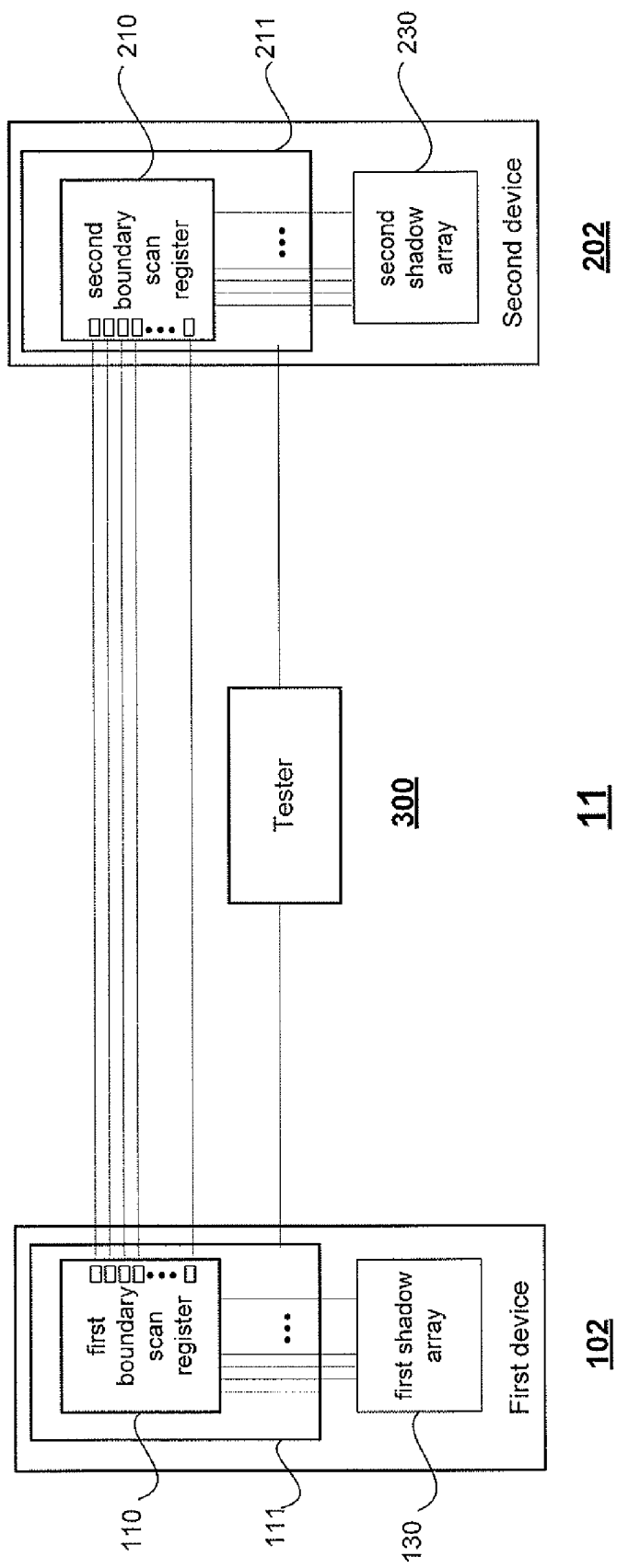
FIG. 8 illustrates an example of a system according to yet another embodiment of the invention.

FIG. 8 illustrates an example of an embodiment of system 11. System 11 includes first device 102, second device 202 and tester 300. First device 102 includes first boundary scan register 110, and first shadow array 130. Second device 202 includes second boundary scan register 210 and second shadow array 230.

First shadow array 130 can send multiple test words, one after the other to first boundary scan register 110 while second shadow array 230 can receive the content of second boundary scan register 210, time after time.

The shadow arrays facilitate a writing sequence of multiple (more than two) consecutive writing iterations, and especially a writing sequence that is characterized by a high frequency.

Figure 9:
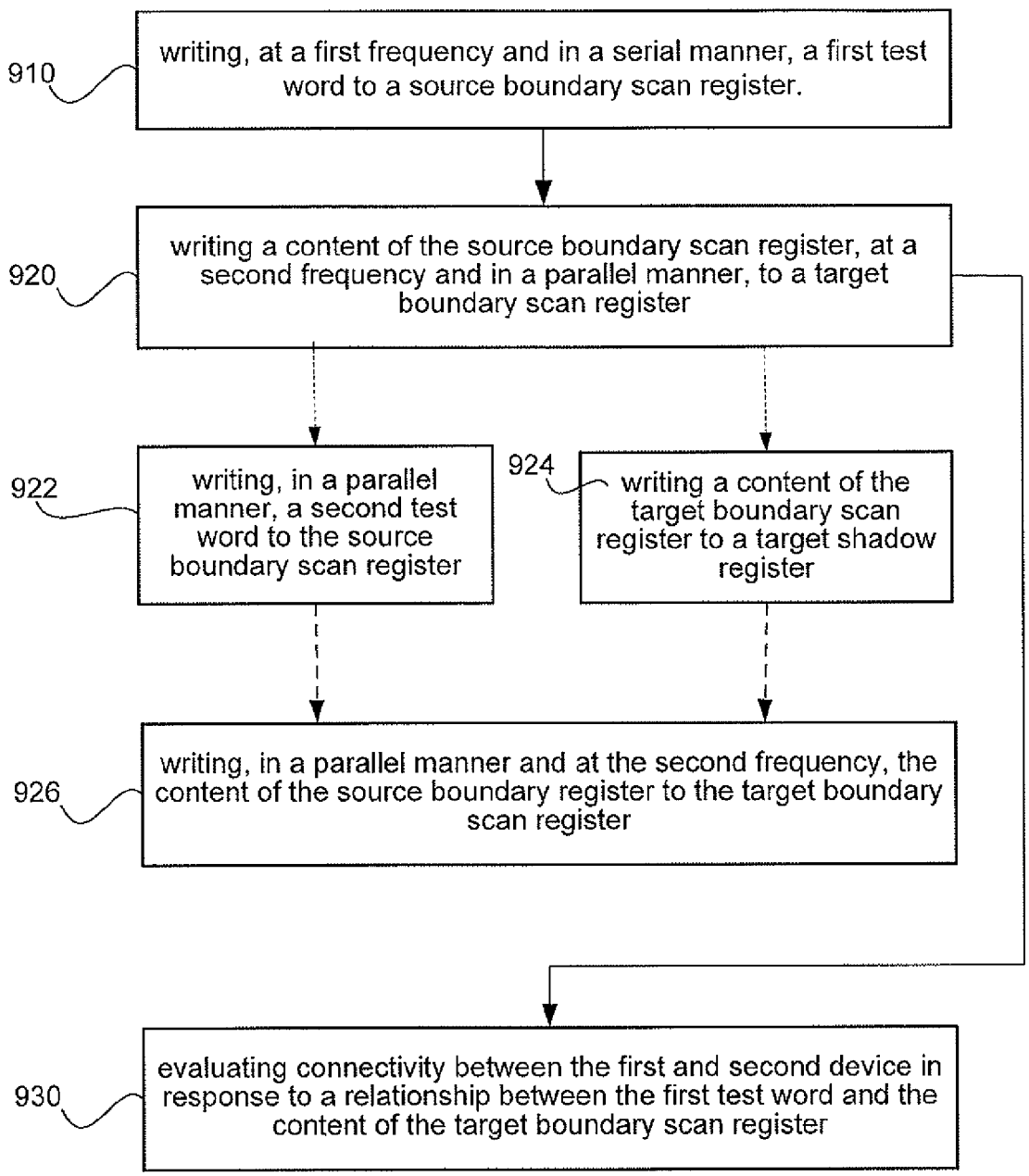
FIG. 9 illustrates a flow diagram of a method according to yet another embodiment of the invention.

FIG. 9 illustrates an example of an embodiment of method 900.

Method 900 starts by stage 910 of writing, at a first frequency and in a serial manner, a first test word to a source boundary scan register.

Stage 910 is followed by stage 920 of writing a content of the source boundary scan register, at a second frequency and in a parallel manner, to a target boundary scan register. The second frequency is higher than the first frequency.

The second frequency may be an operational frequency of the first device and the first frequency may be a boundary scan register input frequency that is lower than one half of the second frequency.

The source and target boundary scan registers are selected from a first boundary scan register of the first device and a second boundary scan register of the second device. For example, the source boundary scan register can be the first boundary scan register and the second boundary scan register can be the target boundary scan register. Yet for another example, the target and source boundary scan registers may be the same boundary scan registers. Yet for a further example, target boundary scan register differs from the source boundary scan register.

Stage 920 is followed by stage 930 of evaluating connectivity between the first and second device in response to a relationship between the first test word and the content of the target boundary scan register.

Stage 920 may be followed by stages 922 and 924. Stage 922 includes writing, in a parallel manner, a second test word to the source boundary scan register. Stage 924 includes writing a content of the target boundary scan register to a target shadow register. Stages 922 and 924 may be followed by stage 926 of writing, in a parallel manner and at the second frequency, the content of the source boundary register to the target boundary scan register.

If method 900 includes stages 922, 924 and 926 then stage 930 includes evaluating of the connectivity between the first and second device is responsive to the first test word, the second test word, a content of the target shadow register and the content of the source boundary scan register.

Stages 920 and 924 may form a writing sequence of a second frequency.

Stage 922 may includes writing the second test word from a first shadow register that is coupled in a parallel manner to the source boundary scan register.

The boundary scan register can include multiple groups of boundary scan cells that can be connected to each other via logic that facilitates a reception of data in various manners. For example, a group of serially connected boundary scan cells can be connected to each other via a multiplexer that can select whether to receive data from a previous group of serially coupled boundary scan cells (thus facilitating sequential propagation of data within the boundary scan register) or receive data from another source—such as from another boundary scan register. Multiple (M) groups that includes K boundary scan cells can receive a sequence of K data bits—of M bits each. Accordingly, a boundary scan register that includes multiple (M) groups, each including K boundary scan cells can receive a sequence of K test words each of M-bits long. This configuration also facilitates writing sequences of high frequency.

Additionally or alternatively, the boundary scan register can include multiple groups of boundary scan cells that can be connected to each other via logic that facilitates writing data in various manners. For example, a group of serially connected boundary scan cells can be connected to each other via logic that can select whether to write data from one group of boundary scan cells to a consecutive group of boundary scan cells or to output the data.

The boundary scan register may include multiple groups of boundary scan cells. The boundary scan cells of these groups are connected to a logic that selects whether to (i) serially connect different groups of boundary cells to each other or (ii) connect the groups of boundary cell cells in parallel to each other.

Figure 10:
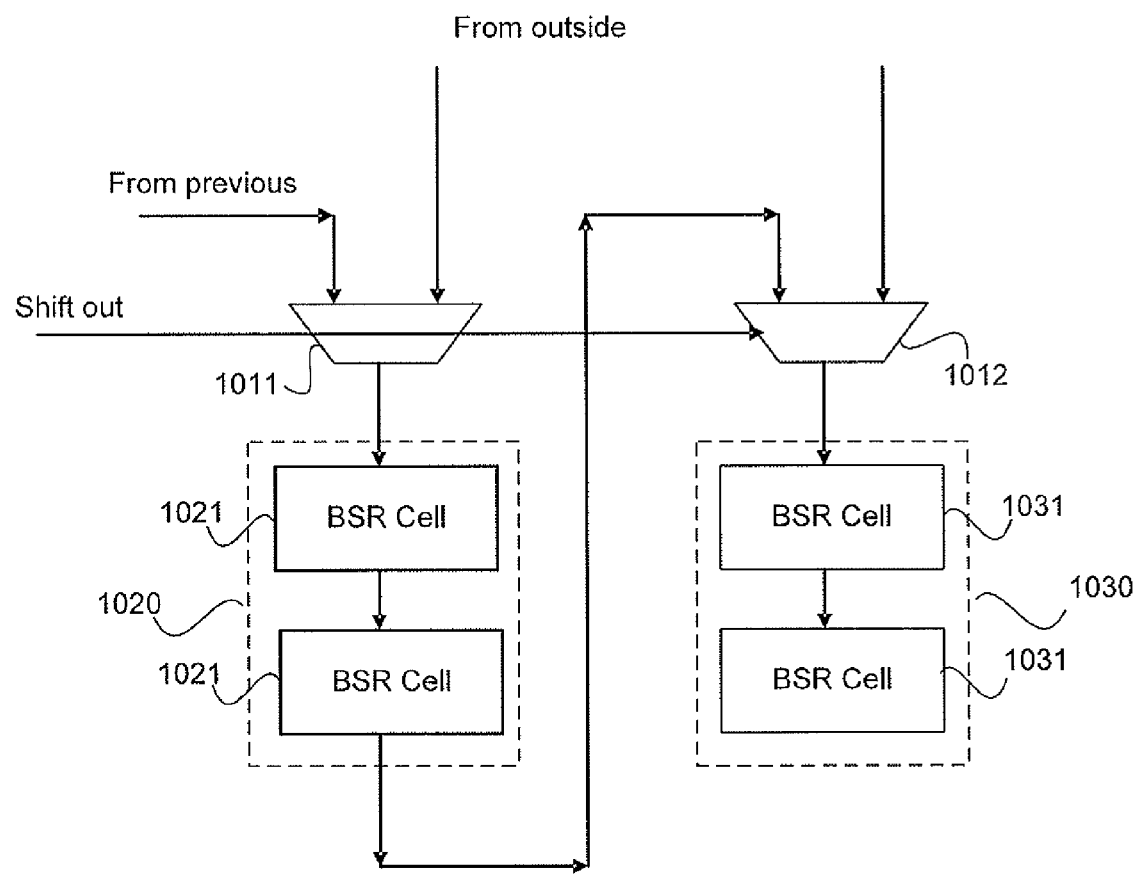
FIG. 10 illustrates an example of an embodiment of the present invention for two groups of boundary scan cells and logic.

FIG. 10 illustrates an example of an embodiment of two groups 1020 and 1030 of boundary scan cells and logic that includes multiplexers 1011 and 1012. This facilitates writing a pair of test words to the boundary scan register at a high frequency—one test word after the other. Group 1020 includes two boundary scan cells 1021 and 1022. Group 1030 includes two boundary scan cells 1031 and 1032. Group 1020 is serially connected to group 1030 via a multiplexer 1012 that feeds boundary scan cell 1031 of group 1030. Multiplexer 1012 can select bits from either group 1020 or from another source. A multiplexer 1011 can select words from either a previous iteration or from another source and feeds group 1020.

Figure 11:
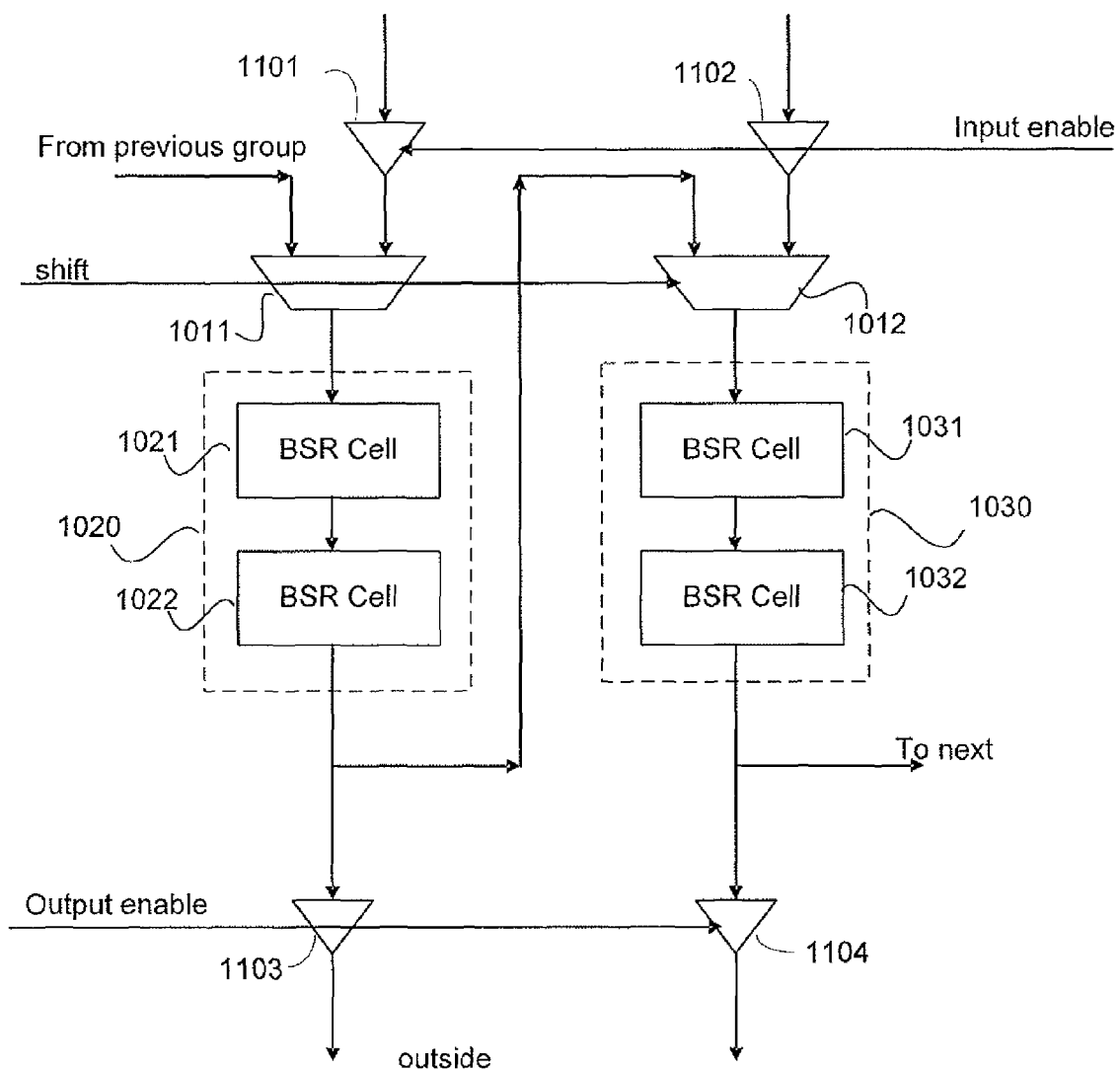
FIG. 11 illustrates an example of another embodiment of the present invention for two groups of boundary scan cells and logic.

FIG. 11 illustrates an example of an embodiment of two groups 1020 and 1030 of boundary scan cells and logic that includes multiplexers 1011 and 1012 as well as buffering (isolating) elements 1101, 1102, 1103 and 1104. This facilitates writing a pair of data words to the boundary scan register at a high frequency and outputting the content of one group 1020 of boundary scan cells to another group 1030 of boundary scan cells or outputting the content to another location—such as another boundary scan register of another device.

In the foregoing, the invention has been elucidated with reference to specific examples of embodiments of the invention. It will, however, be evident that various modifications and changes may be made therein without departing from the broader spirit and scope of the invention as set forth in the appended claims. For example, the masking unit can be implemented by an interleaved masking unit and a non-interleaved masking unit.

Furthermore, those skilled in the art will recognize that the architectures depicted herein are merely exemplary, and that in fact many other architectures can be implemented which achieve the same functionality and that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for testing connectivity between a first device and a second device, the method comprising:
    writing, at a first frequency and in a serial manner, a first test word to a source boundary scan register;
    writing a content of the source boundary scan register, at a second frequency and in a parallel manner, to a target boundary scan register, wherein the second frequency is higher than the first frequency;
    reading the content of the target boundary scan register, wherein the source and target boundary scan registers are selected from a first boundary scan register of the first device and a second boundary scan register of the second device; and
    evaluating a connectivity between the first and second device in response to a relationship between the first test word and the content of the target boundary scan register.

2. The method according to claim 1, wherein the target boundary scan register differs from the source boundary scan register.

3. The method according to claim 1, wherein the source boundary scan register is the target boundary scan register.

4. The method according to claim 1, wherein the second frequency is an operational frequency of the first device and wherein the first frequency is a boundary scan register input frequency that is lower than one half of the second frequency.

5. The method according to claim 4, wherein the writing of the first test word and the writing of the second test word provide a writing sequence of a second frequency.

6. The method according to claim 4, wherein the writing of the second test word to the source boundary scan register comprises writing the second test word from a first shadow register that is coupled in a parallel manner to the source boundary scan register.

7. The method according to claim 1, further comprising:
    writing, in a parallel manner, a second test word to the source boundary scan register;
    writing a content of the target boundary scan register to a target shadow register; and
    writing, in a parallel manner and at the second frequency, the content of the source boundary register to the target boundary scan register, wherein the evaluating of the connectivity between the first and second device is responsive to the first test word, the second test word, a content of the target shadow register and the content of the source boundary scan register.

8. The method according to claim 7, wherein the writing of the second test word to the source boundary scan register comprises writing the second test word from a first shadow register that is coupled in a parallel manner to the source boundary scan register.

9. The method according to claim 1, wherein the writing of the content of the source boundary scan register to a target boundary scan register comprises writing the content of the first boundary scan register to the second boundary scan register and writing the content of the second boundary scan register to the first boundary scan register.

10. The method according to claim 1, comprising providing multiple test words, at a high frequency, to multiple groups of boundary scan cells, one test word after the other; wherein each group of boundary scan cells comprises multiple boundary scan cells that are serially coupled to each other.

11. A system, comprising a first device, a second device and a tester,
    wherein the first device comprises a first boundary scan register and the second device comprises a second boundary scan register,
    wherein the first boundary scan register and the second boundary scan register are coupled to each other in a parallel manner,
    wherein the first boundary scan register is configured to receive in a serial manner and at a first frequency, a first test word,
    wherein the tester is configured to control a writing of a content of a source boundary scan register at second frequency and in a parallel manner, to a target boundary scan register,
    wherein the second frequency is higher than the first frequency,
    wherein the source and target boundary scan registers are selected from the first and second boundary scan registers,
    wherein the tester is configured to read the content of the target boundary scan register and evaluate a connectivity between the first and second devices, in response to a relationship between the first test word and the content of the target boundary scan register.

12. The system according to claim 11, wherein the target boundary scan register differs from the source boundary scan register.

13. The system according to claim 11, wherein the source boundary scan register is the target boundary scan register.

14. The system according to claim 11, wherein the second frequency is an operational frequency of the first device and wherein the first frequency is a boundary scan register input frequency that is lower than one half of the second frequency.

15. The system according to claim 14, comprising a source shadow register that is coupled in a parallel manner to the source boundary scan register; wherein the controller is configured to control the writing of the second test word to the source boundary scan register from the source shadow register.

16. The system according to claim 11, further comprising target shadow register, wherein the tester is configured to:
    control a writing, in a parallel manner, of a second test word to the source boundary scan register;
    control a writing of a content of the target boundary scan register to the target shadow register;
    control a writing, in a parallel manner and at the second frequency, of the content of the source boundary register to the target boundary scan register; and
    evaluate of the connectivity between the first and second device in response to the first test word, the second test word, a content of the target shadow register and the content of the source boundary scan register.

17. The system according to claim 16, wherein the controller is configured to control a writing of a second frequency;

wherein the writing sequence comprises writing of the first test word and writing of the second test word.

18. The system according to claim 17, comprising a source shadow register that is coupled in a parallel manner to the source boundary scan register; wherein the controller is configured to control the writing of the second test word to the source boundary scan register from the source shadow register.

19. The system according to claim 11, wherein the controller is configured to control a content of the first boundary scan register to the second boundary scan register and a writing of the content of the second boundary scan register to the first boundary scan register.

20. The system according to claim 11, wherein the boundary scan register comprises multiple groups of boundary scan cells; wherein the boundary scan cells are coupled to a logic that selects whether to serially couple different groups of boundary cells to each other or to couple the groups of boundary cell cells in parallel to each other.

* * * * *